US006236575B1

(12) United States Patent
Ritter

(10) Patent No.: US 6,236,575 B1

(45) Date of Patent: May 22, 2001

(54) REDUCED-NOISE RELAY

(75) Inventor: Peter Ritter, Berlin (DE)

(73) Assignee: Tyco Electronics Logistics AG, Steinach (CH)

( * ) Notice: Subject to any disclaimer, the term of this patent is extended or adjusted under 35 U.S.C. 154(b) by 0 days.

(21) Appl. No.: 09/275,983

(22) Filed: Mar. 25, 1999

(30) Foreign Application Priority Data

Mar. 26, 1998 (DE) ........................................... 198 13 530

(51) Int. Cl.[7] ................................ H05K 7/00; H02K 5/00

(52) U.S. Cl. .......................... 361/819; 361/816; 439/271; 181/198; 181/202

(58) Field of Search .................................... 361/724, 745, 361/801, 796, 819, 800, 816, 818; 439/271; 174/50; 181/198, 202

(56) References Cited

U.S. PATENT DOCUMENTS 4,258,821 * 3/1981 Wendt et al. ........................ 181/200
5,407,330 * 4/1995 Rimington et al. .................. 471/312
5,579,211 * 11/1996 Hendel ................................ 361/819
5,596,483 * 1/1997 Wyler ................................... 361/683
6,005,768 * 12/1999 Jo ........................................ 361/685

FOREIGN PATENT DOCUMENTS 3-12742 5/1991 (JP) .

* cited by examiner

*Primary Examiner*—Jayprakash N. Gandhi
(74) *Attorney, Agent, or Firm*—Schiff Hardin & Waite

(57) ABSTRACT

A reduced-noise relay has an inside housing and an outside housing. Inside terminals are connected to outside terminals via stranded conductors. An additional intermediate cap of elastomer is plugged over the inside housing with the stranded conductors in the interspace between the inside housing and the outside housing. Together with a damping frame and a damping plate, the intermediate cap effects a sound decoupling of the relay from the outside.

15 Claims, 2 Drawing Sheets

REDUCED-NOISE RELAY

BACKGROUND OF THE INVENTION

The invention is directed to a reduced-noise relay, comprising an inside housing from which inside terminals emerge through an inside terminal side, an outside housing from which outside terminals emerge through an outside terminal side opposite the inside terminal side, and flexible connecting conductors that extend between the respective sidewalls of the inside housing and of the outside housing and connect the inside terminals to respectively corresponding outside terminals.

It has already been variously proposed for damping the switching noises of a relay to introduce a relay encapsulated in an inside housing into an additional outside housing and to connect the electrical terminals between the inside housing and the outside housing via more or less flexible lines. Such embodiments are disclosed, for example, by JP-03-127 424 A. However, there is the problem that the noise transmission from the inside housing to the outside housing can only be inadequately prevented. When the flexible connecting conductors are implemented as comparatively stable sheet metal bands, they can in fact retain the inside housing spaced from the outside housing on all sides; however, they themselves transmit a relatively high proportion of the noise. When, however, these connecting conductors are manufactured of very soft material, then the connecting conductors cannot hold the inside housing at a stable distance from the outside housing. There is therefore the risk that the inside housing, for example following external blows, will lie against the outside housing at at least one side and transmit the switching noise directly onto the outside housing.

SUMMARY OF THE INVENTION

An object of the present invention is to improve a relay having a double-walled housing structure conforming to the type initially cited such that the noise transmission toward the outside is reduced further and that this noise reduction is also reliably retained.

This object is achieved in that an intermediate cap of elastic plastic is plugged over the inside housing and the connecting conductors, the intermediate cap, together with the connecting conductors, separating the inside housing from the outside housing on all sides.

Given the design of the invention, damping material in the form of an intermediate cap is arranged in the interspace between the inside housing and the outside housing, so that the inside housing cannot come into contact with the outside housing at any side. The connecting conductors, which are preferably designed as stranded conductors, can thereby be so soft that they likewise transmit no oscillations. The intermediate cap itself is preferably composed of elastomer. The end sections of the connecting conductors are preferably held by lead-throughs of a damping frame in the region of the open side of the intermediate cap. A damping plate, which is likewise composed of elastomer or a similar substance, can preferably additionally secure the distance between the inside housing and the outside housing in the space between the ends of the connecting conductors or the outside terminals.

The outside housing is preferably composed of an outside cap and of a base. The base can thereby comprise its own outside terminals, for example in the form of flat plugs, that are anchored in the material of the base by embedding or plugging. At the inside of the base, these outside terminals are then connected to the ends of the connecting conductors, which can occur with standard connection techniques, preferably by welding.

The invention is explained in greater detail below with reference to an exemplary embodiment on the basis of the drawings.

DESCRIPTION OF THE PREFERRED EMBODIMENTS

Figure 1:
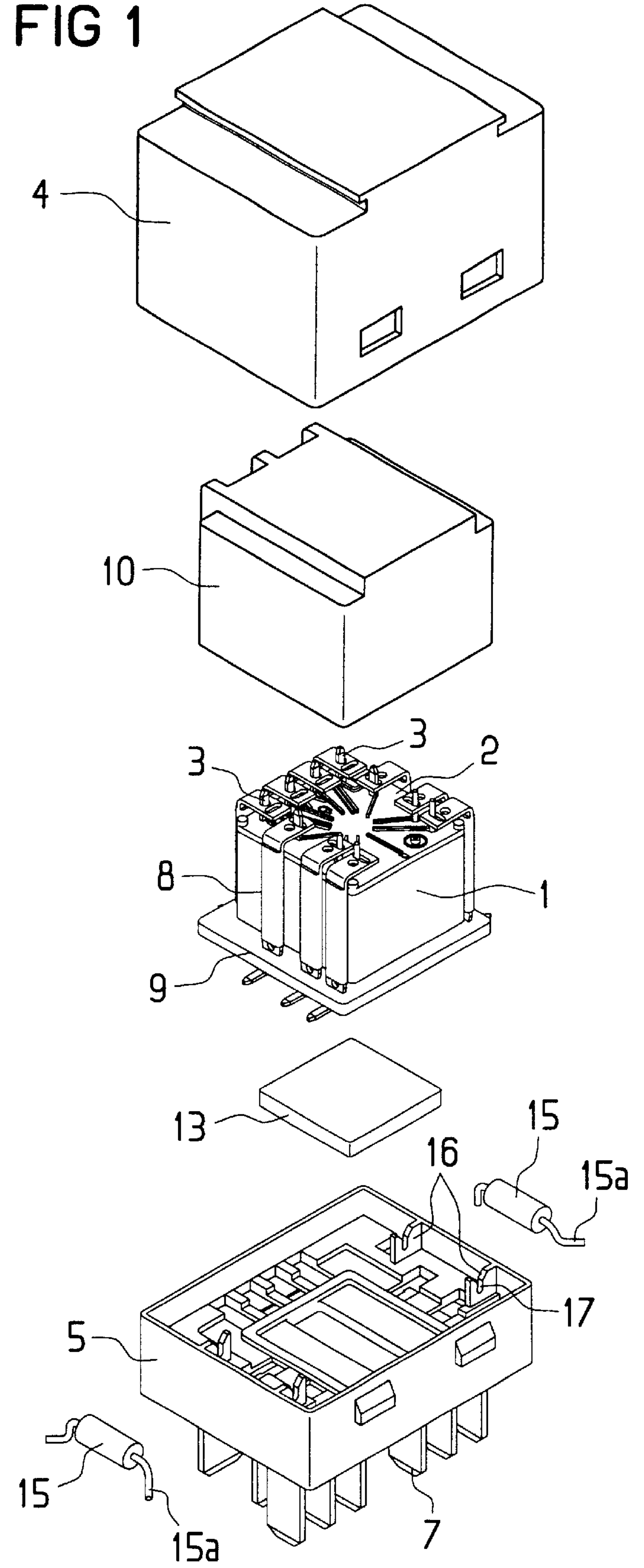
FIG. 1 is a relay of the invention with the various housing parts, shown in an exploded view.
Figure 2:
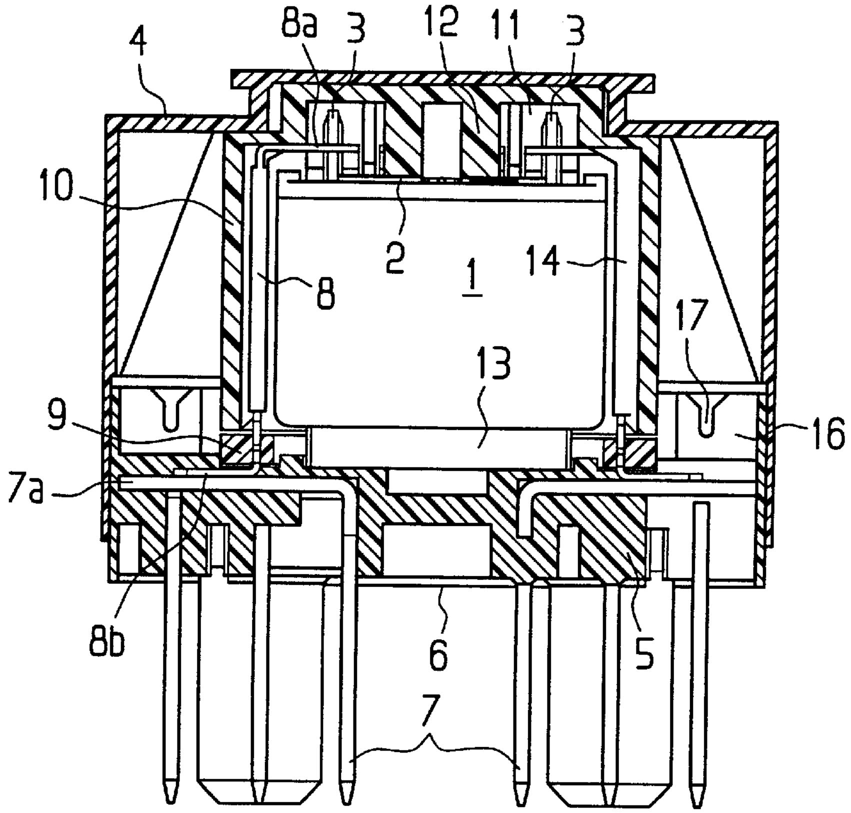
FIG. 2 is a section through a completely assembled relay according to FIG. 1.
Figure 3:
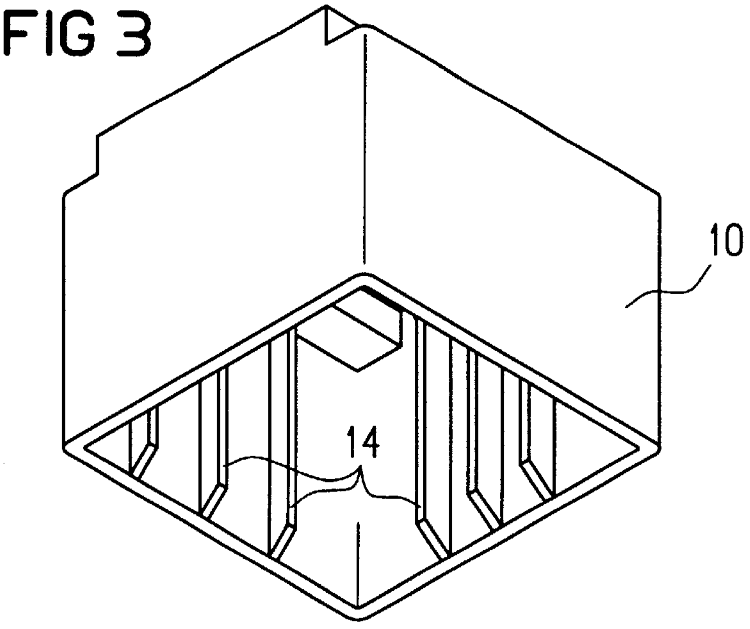
FIG. 3 is a perspective illustration looking into the inside of an intermediate cap according to FIGS. 1 and 2.

The relay shown in FIGS. 1 through 3 has an inside housing 1 in which the relay system itself, which has a structure that is not shown in detail, is arranged. The relay housing 1 has a terminal side 2 from which inside terminals 3 emerge in a traditional way. This inside housing is arranged in an outside housing at a distance therefrom on all sides, the outside housing being essentially formed by an outside cap 4 and a base 5. This base 5 lies opposite the inside terminal side 2 and forms an outside terminal side 6 from which outside terminals in the form of flat plugs 7 emerge.

The flat plugs 7, which are injection molded in the material of the base 5 in the present example, are connected via flexible connecting conductors in the form of stranded conductors 8 to the inside terminals 3 that extend essentially along the outside of the inside housing 1. They respectively have one end **8*a* in the region of the inside terminal side 2 bent off at a right angle toward the inside terminals 3 and are connected thereto, for example by soldering. With their opposite ends 8*b*, which are respectively compressed like the first-cited ends 8*a*, the stranded conductors 8 are conducted through a damping frame 9, bent off at the underside thereof and connected to angled-off terminal tabs 7*a* of the flat plugs 7, preferably by welding. The damping frame 9 is likewise composed of elastic plastic, preferably an elastomer. This damping frame 9 holds the stranded conductors 8** in the desired position during assembly and additionally prevents the transmission of oscillations onto the outside housing, i.e. onto the base.

An intermediate cap 10 is inverted over the inside housing 1, the cap 10 being composed of elastic plastic, preferably elastomer, and assuring a predetermined spacing as well as a noise decoupling between the inside housing 1 and the outside cap 4. The intermediate cap 10 comprises respective recesses 11 in the region of the inside terminals 3, so that oscillations are likewise not transmitted in this region. In the region between the inside terminals 3, it also has noses 12 respectively directed toward the inside housing that press against the terminal side 2 of the inside housing. Lying opposite these noses 12, a damping plate 13 that is likewise composed of elastomer or of some other elastic plastic is also provided in the region between the outside terminals, or within the damping frame 9. After engagement of the outside cap 4 at the base 5, thus the inside housing of the relay is clamped between the elastic noses 12 and the elastic damping plate 13. In this way, it is held at a distance from the outside housing on all sides but is decoupled with respect to the transmission of sound oscillations. As can be derived from FIGS. 2 and 3, the inside of the intermediate cap 10 has extending reinforcing ribs 14 that respectively extend between the individual connecting conductors 8. They thereby prevent the stranded conductors or individual fibers of the stranded conductors from touching one another and potentially causing a short.

Further components can be accommodated in the space between the intermediate cap 10 and the outside cap 4. Resistors 15 that can be connected parallel to the relay coils are shown in the present example. For holding, upwardly extending ribs 16 are applied to the base 5, these having slots 17 for the acceptance of the resistor terminals 15*a*. The terminals 15*a* are welded to clips 7*a* of the flat plugs 7 in a known way.

Although various minor modifications might be suggested by those skilled in the art, it should be understood that I wish to embody within the scope of the patent warranted hereon all such modifications as reasonably and properly come with the scope of my contribution to the art.

I claim as my invention:

1. A reduced-sound relay, comprising:

an inside housing from which inside terminals emerge through an inside terminal side at an upper portion of the inside housing;

an outside housing from which outside terminals emerge through an outside terminal side at a bottom portion of the inside housing and opposite the inside terminal side;

flexible connecting conductors that extend between the respective sidewalls of the inside housing and of the outside housing and connect the inside terminals to the respectively corresponding outside terminals; and an intermediate cap of elastic plastic plugged over the inside housing and the connecting conductors, said cap, together with the connecting conductors, separating the inside housing from the outside housing on all sides.

2. The relay according to claim 1 wherein the intermediate cap is formed of elastomer.

3. The relay according to claim 1 wherein the connecting conductors comprise flat stranded conductors whose end sections are compressed to form terminal elements.

4. The relay according to claim 3 wherein the end sections of the connecting conductors are held in lead-throughs of a damping frame in a region of an open side of the intermediate cap.

5. The relay according to claim 1 wherein the connecting conductors are coined in a region of the inside terminal side, are bent inward at a right angle and connect to the inside terminals of the relay.

6. The relay according to claim 1 wherein the intermediate cap comprises inwardly salient ribs that extend between the connecting conductors.

7. The relay according to claim I wherein the outside housing comprises an outside cap and a base, and the outside terminals are held in the base.

8. The relay according to claim 7 wherein the outside terminals are anchored in the base and are connected to free end sections of the connecting conductors.

9. The relay according to claim 8 wherein the outside terminals comprise angled-off terminal tabs in a region of an inside of the base, angled-off end sections of the connecting conductors being secured thereon lying flat.

10. The relay according to claim 9 wherein the angled off end sections are welded for the securing.

11. The relay according to claim 7 wherein a damping plate of elastic plastic is arranged between the inside housing and the base in a region surrounded by end sections of the connecting conductors.

12. The relay according to claim 11 wherein said elastic plastic comprises elastomer.

13. The relay according to claim 1 wherein at least one separate component is received and mounted in a space between the outside housing and the intermediate cap.

14. The relay according to claim 7 wherein the base comprises ribs projecting into an interior of the outside housing, and wherein at least one separate component is received on a mounting structure on said base so that said at least one separate component is positioned in a space between the outside housing and the intermediate cap.

15. A reduced-sound relay comprising:

an inside housing from which inside terminals emerge through an inside terminal side;

an outside housing from which outside terminals emerge through an outside terminal side;

flexible connecting conductors that extend between the respective sidewalls of the inside housing and of the outside housing and connect the inside terminals to the respectively corresponding outside terminals; and an intermediate cap of plastic plugged over the inside housing and the connecting conductors, said cap separating the inside housing from the outside housing at a top and lateral sides of the inside housing.

* * * * *